United States Patent
Rubenstein et al.

(10) Patent No.: US 9,055,698 B2
(45) Date of Patent: Jun. 9, 2015

(54) FLUID FLOW CONTROL FOR COMPUTING DEVICE

(75) Inventors: Brandon Rubenstein, Loveland, CO (US); Roy Zeighami, Mckinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 151 days.

(21) Appl. No.: 13/387,068

(22) PCT Filed: Feb. 26, 2010

(86) PCT No.: PCT/US2010/025695
§ 371 (c)(1),
(2), (4) Date: Jan. 25, 2012

(87) PCT Pub. No.: WO2011/106024
PCT Pub. Date: Sep. 1, 2011

(65) Prior Publication Data
US 2012/0325013 A1    Dec. 27, 2012

(51) Int. Cl.
*H05K 7/20* (2006.01)
*G06F 1/20* (2006.01)
*G06F 1/32* (2006.01)

(52) U.S. Cl.
CPC ............ *H05K 7/20836* (2013.01); *G06F 1/20* (2013.01); *G06F 1/206* (2013.01); *G06F 1/3203* (2013.01); *H05K 7/20727* (2013.01)

(58) Field of Classification Search
CPC .. G06F 1/20; H05K 7/20736; H05K 7/20827; H05K 7/20836; H05K 7/2079; H05K 7/20718; G01F 1/684; G01F 1/6842

USPC ............ 73/204.11, 204.15, 204.16, 204.19, 73/861, 861.01; 361/688–695, 679.48, 361/679.49
See application file for complete search history.

(56) References Cited

U.S. PATENT DOCUMENTS

| | | | |
|---|---|---|---|
| 5,209,398 A | 5/1993 | Drees | |
| 7,010,392 B2 | 3/2006 | Bash et al. | |
| 7,031,154 B2 | 4/2006 | Bash et al. | |
| 7,438,638 B2 * | 10/2008 | Lewis et al. | 454/184 |
| 7,486,513 B2 * | 2/2009 | Hall et al. | 361/699 |
| 7,551,436 B2 * | 6/2009 | Hata et al. | 361/695 |
| 7,630,198 B2 * | 12/2009 | Doll | 361/679.49 |
| 7,682,234 B1 * | 3/2010 | Beitelmal et al. | 454/256 |
| 7,898,799 B2 * | 3/2011 | Doll | 361/679.48 |
| 7,995,339 B2 * | 8/2011 | Bash et al. | 361/692 |

(Continued)

OTHER PUBLICATIONS

Yunus A. çengel, "Heat and Mass Transfer—A Practical Approach, Chapter 15: Cooling of Electronic Equipment", 2007, pp. 15-1-15-69.*

*Primary Examiner* — David A Rogers
(74) *Attorney, Agent, or Firm* — Hewlett-Packard Patent Department

(57) ABSTRACT

Flow measurement systems and methods are provided. A flow measurement system can include at least one heat-producing computing device having at least one fluid inlet and one fluid outlet. The system can further include at least one inlet fluid temperature sensor and at least one outlet fluid temperature sensor. At least one current sensor measuring the current supplied to at least a portion of the at least one heat-producing computing device can also be included with the system. The system can also include at least one calculating device adapted to calculate the inlet fluid flow rate based at least in part upon the sensed inlet fluid temperature, the sensed outlet fluid temperature, and the sensed current flow.

16 Claims, 4 Drawing Sheets

(56) References Cited

U.S. PATENT DOCUMENTS

| | | | |
|---|---|---|---|
| 8,164,434 B2* | 4/2012 | Gross et al. | 340/501 |
| 8,203,837 B2* | 6/2012 | Zeighami et al. | 361/679.46 |
| 8,238,104 B2* | 8/2012 | Salpeter | 361/716 |
| 8,348,731 B2* | 1/2013 | Johnson et al. | 454/184 |
| 2004/0217072 A1* | 11/2004 | Bash et al. | 211/26 |
| 2006/0091229 A1 | 5/2006 | Bash et al. | |
| 2006/0162351 A1 | 7/2006 | Yahia | |
| 2006/0162442 A1* | 7/2006 | Matsumoto et al. | 73/204.15 |
| 2008/0245083 A1 | 10/2008 | Tutunoglu et al. | |
| 2008/0289411 A1* | 11/2008 | Schrag et al. | 73/204.11 |
| 2009/0030554 A1 | 1/2009 | Bean et al. | |
| 2009/0041079 A1 | 2/2009 | Claassen et al. | |
| 2009/0192748 A1 | 7/2009 | Palmer et al. | |
| 2009/0205416 A1 | 8/2009 | Campbell et al. | |
| 2009/0223234 A1* | 9/2009 | Campbell et al. | 62/127 |
| 2010/0023295 A1 | 1/2010 | Gross et al. | |
| 2010/0037688 A1* | 2/2010 | Inoue et al. | 73/204.11 |
| 2010/0076607 A1 | 3/2010 | Ahmed et al. | |
| 2013/0006426 A1* | 1/2013 | Healey et al. | 700/278 |
| 2013/0062047 A1* | 3/2013 | Vaney et al. | 165/287 |
| 2013/0128455 A1* | 5/2013 | Koblenz et al. | 361/692 |
| 2013/0133350 A1* | 5/2013 | Reytblat | 62/259.2 |

* cited by examiner

FLUID FLOW CONTROL FOR COMPUTING DEVICE

BACKGROUND OF THE INVENTION

Description of the Related Art

Thermal management presents considerable challenges within a computing environment. Controlling cooling fluid flow to the various, components disposed within a computing environment often requires rather precise knowledge of the heat being generated by the device in order to properly match the cooling system to the specific demands presented by the component. Balancing cost efficient, environmentally friendly operation of the cooling equipment against the very specific cooling requirements of the various components found within the computing environment is frequently of paramount importance to manufacturers, owners, and operators of the computing environment.

BRIEF DESCRIPTION OF THE DRAWINGS

Advantages of one or more disclosed embodiments may become apparent upon reading the following detailed description and upon reference to the drawings in which.

DETAILED DESCRIPTION

The accurate measurement of fluid flow about computing devices is frequently of great importance, particularly in computing intensive environments such as those found in server rooms and data centers. Balancing fluid flow amongst a myriad of computing devices is often performed based upon the heat generated by the computing device and the overall flow of fluid through the computing device.

At least one flow measurement system is therefore provided. A flow measurement system can include at least one heat-producing computing device having at least one fluid inlet and one fluid outlet. The system can further include at least one fluid inlet temperature sensor and at least one fluid outlet temperature sensor. At least one current sensor measuring the current supplied to at least a portion of the at least one heat-producing computing device can also be included with the system. The system can also include at least one calculating device adapted to calculate the inlet fluid flow rate based at least in part upon the sensed fluid inlet temperature, the sensed fluid outlet temperature, and the sensed current flow.

At least one flow measurement method is also provided. The method can include measuring a fluid inlet temperature to at least one heat-producing computing device using at least one fluid inlet temperature sensor. The method can further include measuring the input current to at least one heat-producing computing device disposed at least partially within the enclosure using at least one current sensor. The method can include measuring a fluid outlet temperature from the at least one heat-producing computing device using at least one fluid outlet temperature sensor. The method can further include calculating the heat generated by the heat-producing computing device based upon the input current using at least one calculating device. The method can also include calculating the differential temperature by subtracting the fluid inlet temperature from the fluid outlet temperature using the at least one calculating device. The method can further include calculating the fluid flow rate to the heat-producing computing device based upon the heat generated and the differential temperature using the at least one calculating device.

Figure 1:
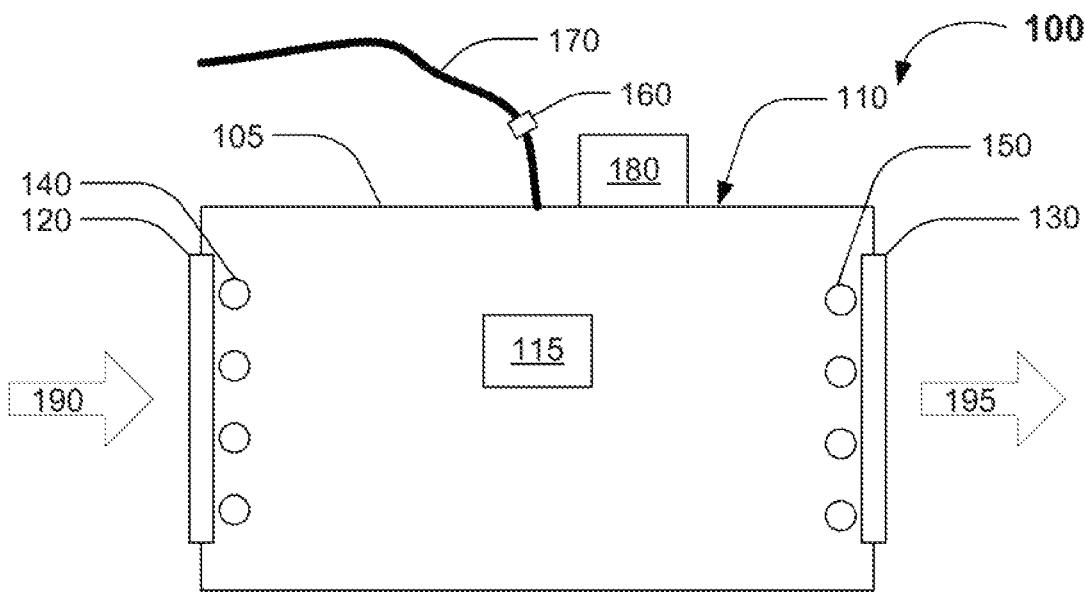
FIG. 1 is a schematic depicting an embodiment of an illustrative flow measurement system, according to one or more embodiments described herein.

FIG. 1 is a schematic depicting an embodiment of an illustrative flow measurement system 100, according to one or more embodiments. In at least some embodiments, the system 100 can include at least one heat-producing computing device 110 having at least one fluid inlet 120 and one fluid outlet 130. The device can further include at least one fluid inlet temperature sensor 140 and at least one fluid outlet temperature sensor 150. The system can include at least one current sensor 160 measuring the current supplied to at least a portion of the heat-producing computing device 110. At least one calculating device 180 can be adapted to calculate the inlet fluid flow rate based at least in part upon the sensed inlet fluid temperature, the sensed outlet fluid temperature, and the sensed current flow.

In at least some embodiments, the heat-producing computing device 110 can include any number of heat-generating devices, systems, or combination of systems and devices 115 capable of providing, producing, or otherwise generating heat. In at least some embodiments, the heat-generating computing device 110 can include any number of housings or enclosures 105. In at least some embodiments, the heat-producing computing device 110 can include one or more heat-generating devices, systems, or combination of systems and devices 115 disposed partially or completely within any number of housings or enclosures 105. In at least some embodiments, the heat-producing computing device 110 can include one or more board mounted electronic components 115 disposed at least partially within the enclosure or housing 105.

In at least some embodiments, at least one fluid inlet 120 and at least one fluid outlet 130 can be disposed in, on, or about the heat-producing computing device 110. The fluid inlet 120 and the fluid outlet 130 can provide the entry and exit points, respectively, for the flow of one or more fluids in, around, through, or about the heat-producing computing device 110. The one or more fluids can include one or more liquids or gasses suitable for transporting heat or thermal energy from the heat-producing computing device 110. Illustrative, non-limiting, liquids can include water, glycol solutions, and the like. Illustrative, non-limiting, gases can include ambient or conditioned air, or similar non-condensing gases or gas mixtures.

Physically, the at least one fluid inlet 120 and the at least one fluid outlet 130 can be of equal or differing shapes, sizes, geometries, or cross-sectional areas. Either one or both of the at least one fluid inlet 120 and the at least one fluid outlet 130 can include or otherwise incorporate one or more flow control devices, for example, one or more variable position flow control valves, dampers, or the like, to control, restrict, impede, alter, or otherwise limit the fluid flow through the heat-producing computing device 110.

The at least one fluid inlet temperature sensor ("inlet sensor") 140 and the at least one fluid outlet temperature sensor ("outlet sensor") 150 can include any number of systems, devices, or any combination of systems and devices adapted to measure and transmit a signal proportionate to the temperature of the fluid flowing about the inlet sensor 140 and the outlet sensor 150. The at least one inlet sensor 140 can be used to measure the temperature of all or a portion of an inlet fluid 190 entering the heat-producing computing device 110. The at least one outlet sensor 150 can be used to measure the temperature of all or a portion of an outlet fluid 195 exiting the heat-producing computing device 110. The at least one inlet sensor 140 and the at least one outlet sensor 150 can include thermocouples, resistive thermal devices ("RTDs"), chip mounted temperature sensors, or any combination thereof. In at least some embodiments, all or a portion of the inlet sensors 140 and the outlet sensors 150 can be communicatively coupled to the calculating device 180.

As used herein, the term "communicative coupling", or a connection by which entities are "communicatively coupled", is one by which electromagnetic signals, physical communications, and/or logical communications may be sent and/or received. Typically, a communicative coupling includes a physical interface, an electrical interface, and/or a data interface, but it is to be noted that a communicative coupling may include differing combinations of these or other types of connections sufficient to allow intermittent or continuous communication or control. For example, two entities can be communicatively coupled by being able to communicate signals to each other directly or through one or more intermediate entities like a processor, operating system, a logic device, software, or other entity. Logical and/or physical communication channels can be used to create a communicative coupling.

At least one current sensor 160 can be used to monitor the electrical current flow to the heat-producing computing device 110. In at least some embodiments, the at least one current sensor 160 can be disposed in on, or about the heat-producing computing device 110 power feed 170. In at least some embodiments, the at least one current sensor 160 can include one or more electrical current sensors, one or more voltage sensors, one or more power factor sensors, one or more power sensors, or any combination or multiples thereof. The at least one current sensor 160 can be a single phase or multi-phase sensor, for example a one, two or three phase sensor.

The calculating device 180 can include any number of systems, devices, or any combination of systems and devices suitable for receiving at least one signal input and performing at least one calculation involving the one or more inputs. In at least some embodiments, the calculating device 180 can generate one or more outputs, for example one or more control outputs, one or more display outputs, or any combination or multiples thereof. In at least some embodiments, the calculating device 180 can be disposed externally or remotely from the heat-producing computing device 110. The calculating device 180 can be a discrete device, for example a dedicated board mount integrated circuit, or a smaller portion of a larger computing device, for example a co-processor housed within a computer central processing unit ("CPU"). In at least some embodiments, the calculating device 180 can be disposed proximate or internal to the heat-producing computing device 110. In at least some embodiments, the calculating device can be at least a portion of the heat-producing computing device 110.

Figure 2:
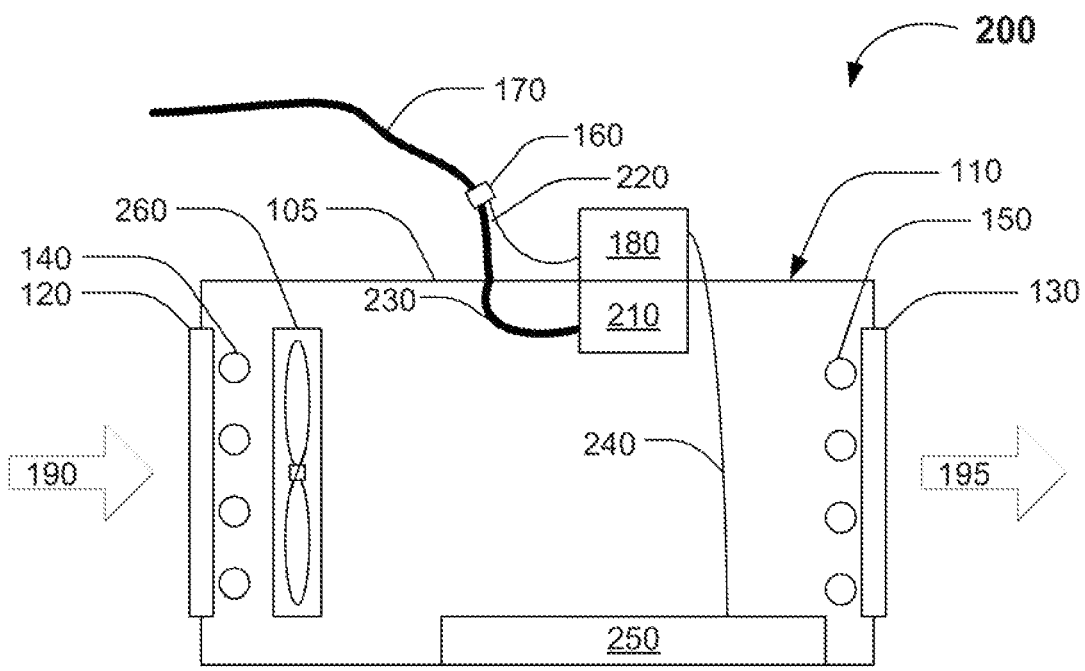
FIG. 2 is a schematic depicting an embodiment of another illustrative flow measurement system, according to one or more embodiments described herein.

FIG. 2 is a schematic depicting an embodiment of another illustrative flow measurement system 200. In at least some embodiments, the heat-producing computing device 110 disposed within the system 200 can include one or more blade computing devices 210. In at least some embodiments, the enclosure 105 can include one or more rack enclosures that partially or completely enclose the one or more blade computing devices 210.

In at least some embodiments, the power 230 required by the one or more blade computing devices 210 can be supplied via the power feed 170. In at least some embodiments, the power supplied to the one or more blade computing devices 210 can be measured using the at least one current sensor 160. The current sensor can be communicatively coupled 220 to the calculating device 180. In at least some embodiments, the heat-producing computing device 110 can include at least one display device 250. In at least some embodiments, the heat-producing computing device 110 can include at least one fluid mover 260.

The one or more blade computing devices 210 can include any number of systems, devices, or any combination of systems and devices suitable for performing one or more functions while mounted in a rack based enclosure 105. The one or more blade computing devices 210 can include, but are not limited to, one or more blade computing devices adapted to provide switching, routing, storage, SAN and fiber-channel access, or any combination thereof. In at least some embodiments, the one or more blade computing devices 210 can include at least one blade mounted server. In at least some embodiments, the one or more calculating devices 180 can be disposed or otherwise incorporated partially or completely within the one or more blade computing devices 210.

The power feed 170 can be coupled to the one or more blade computing devices 210 via one or more power feeds 170. In at least some embodiments, the one or more power feeds 170 can include one or more power supplies (not shown in FIG. 2) disposed internally within the heat-producing computing device. In at least some embodiments, the at least one current sensor 160 can transmit a signal proportional to the current flow through the power feed 170 to the calculating device 180 via the communicative coupling 220.

As used herein, the term "couple" or "coupled" can refer to any form of direct, indirect, optical or wireless electrical connection. The electrical connection can, in one or more embodiments, include, but is not limited to any electrically conductive or magnetically inductive connection linking two or more devices. The connection can be electrically conductive, for example, using one or more conductors such as copper or aluminum wire, conductive strips on a printed circuit board, or the like to connect two or more components. The connection can be magnetically inductive, for example, stimulating the flow of current from a transformer secondary coil by passing a current through a primary coil inductively coupled to the secondary coil. The connection, can be electromagnetic, for example by controlling current flow through a relay contact via an independent relay coil such that passage of a current through the relay coil can magnetically open and close the relay contact.

In at least some embodiments, the calculating device can be coupled 240 to at least one display device 250. The at least one display device 250 can include any number of systems, devices, or any combination of systems and devices suitable for visually or audibly displaying data. Illustrative display devices can include single element light emitting diodes ("LEDs"), a multi-element LED display, a liquid crystal display ("LCD"), a cathode ray tube ("CRT") display, and the like. In some embodiments, the at least one display device 250 can display information related to the at least one heat-producing computing device 110, for example the inlet temperature, outlet temperature, or the current flow. In some embodiments, the at least one display device 250 can display measured information related to the heat-producing computing device 110, for example the inlet temperature, outlet temperature, or the current flow. In some embodiments, the at least one display device can display fluid flow rate through the heat-producing computing device 110.

In at least some embodiments, the fluid flow about the at least one heat-producing computing device 110 can be provided at least in part by at least one fluid mover 260. The fluid mover 260 can include any number of systems, devices, or any combination of systems and devices suitable to initiate, impart, enhance or promote fluid flow in, through, around, or about the at least one heat-producing computing device 110. Illustrative gaseous fluid movers 260 can include one or more centrifugal or axial flow fans. Illustrative liquid fluid movers 260 can include one or more pumps. In at least some embodiments, all or a portion of the power required to operate the at least one fluid mover 260 can be supplied via the power feed 170.

Figure 3:
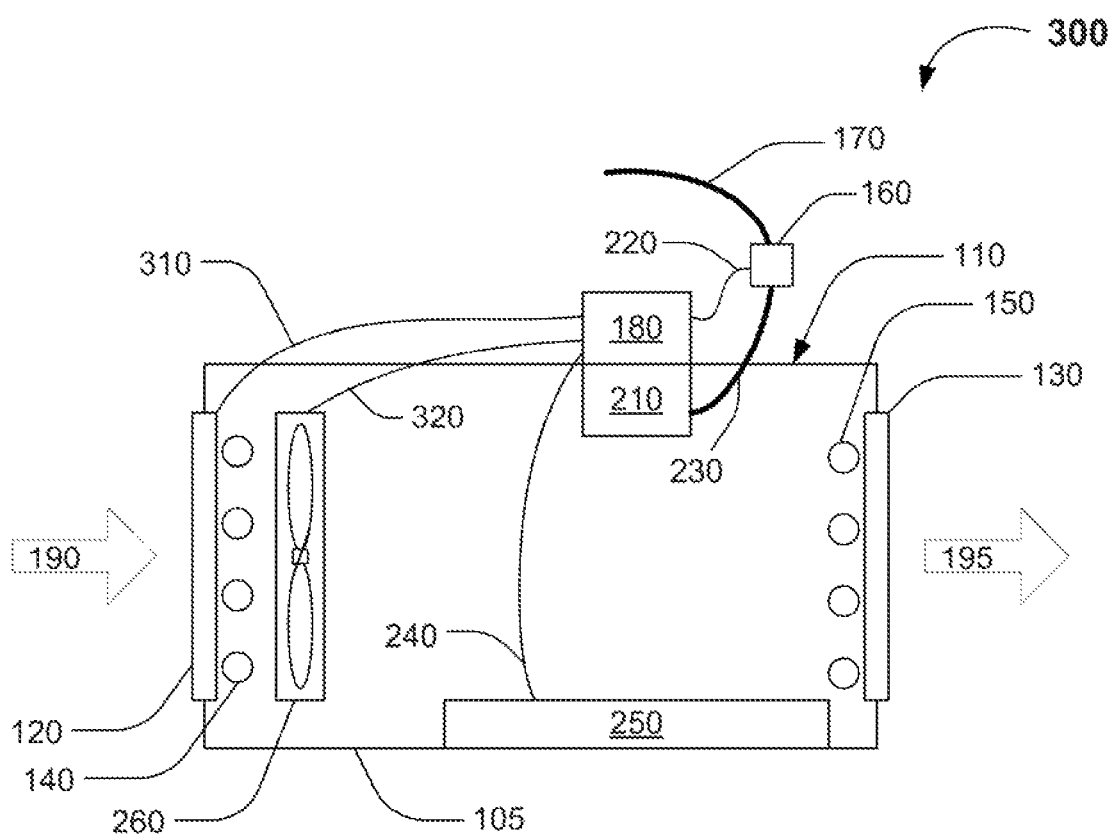
FIG. 3 is a schematic depicting an embodiment of yet another illustrative flow measurement system, according to one or more embodiments described herein.

FIG. 3 is a schematic depicting yet another embodiment of an illustrative flow measurement system 300, according to one or more embodiments. In the system 300, the calculating device 180 can be coupled to at least a portion of the fluid inlet 120. In the system 300, the calculating device 180 can be coupled to the fluid mover 260. In at least some embodiments, the calculating device 180 can control or limit the flow of fluid in, around, through, or about the heat-producing computing device 110 by modulating the cross sectional area of the fluid inlet 120. In at least some embodiments, the calculating device 180 can control or limit the flow of fluid in, around, through, or about the heat-producing computing device 110 by modulating the pumping rate of the fluid mover 260.

Figure 4:
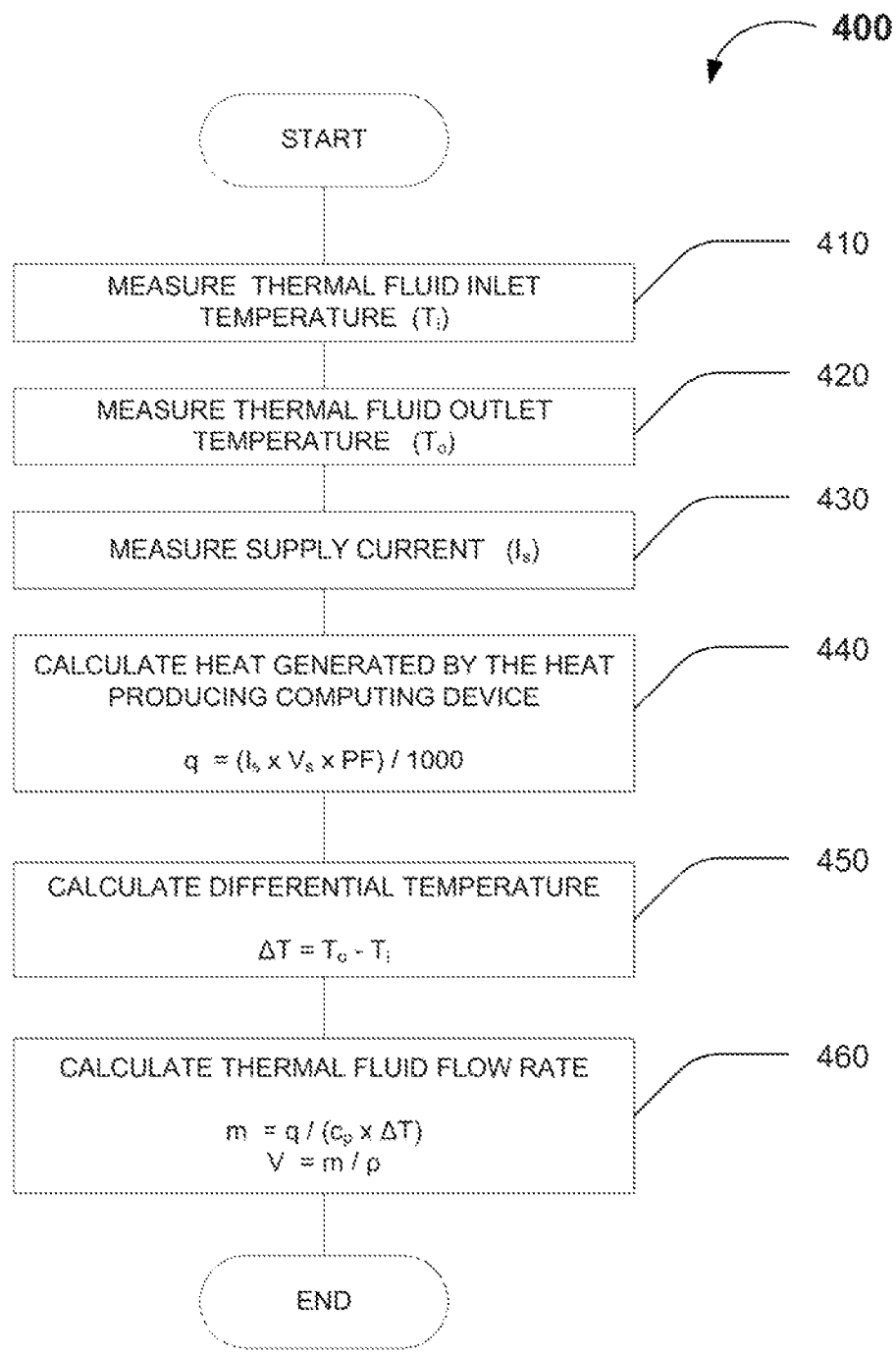
FIG. 4 is a flow diagram depicting an embodiment of an illustrative flow measurement method, according to one or more embodiments described herein.

FIG. 4 is a flow diagram depicting an embodiment of an illustrative flow measurement method. 400, according to one or more embodiments. In at least some embodiments, the method 400 can include measuring the fluid inlet temperature ($T_i$) at 410, using the at least one inlet sensor 140. The temperature measured using the at least one inlet sensor 140 can be transmitted to the coupled calculating device 180. The method 400 can further include measuring the fluid outlet temperature ($T_o$) at 420, using the at least one sensor 150. The temperature measured using the at least one outlet sensor 150 can be transmitted to the coupled calculating device 180.

At 430, the electrical current supplied ($I_s$) to the heat-producing computing device 110 can be measured using the at least one current sensor 160. The current measured using the at least one current sensor 160 can be transmitted to the coupled 220 calculating device 180. At 440, the computing device 180 can calculate the heat ("q") produced by the heat-producing computing device M. In at least some embodiments, at 440, the calculating device 180 can use the following formulas to calculate the heat generated by the heat-producing computing device 110 when supplied 270 with single or three phase alternating current power supplied at a source voltage of $V_s$:

Single Phase (kW): $q=(I_s \times V_s \times PF)/1000$

Three Phase (kW): $q=(I_s \times V_s \times PF \times 1.73)/1000$

Using an average power factor of 0.7, the formulas can be simplified in this example to the following:

Single Phase (BTU/min): $q=I_s \times V_s \times 0.040$

Single Phase (kJ/min): $q=I_s \times V_s \times 0.042$

Three Phase (BTU/min): $q=I_s \times V_s \times 0.069$

Three Phase (kJ/min): $q=I_s \times V_s \times 0.073$

At 450, the calculating device 180 can calculate the temperature differential ("$\Delta T$") between the fluid inlet temperature ("$T_i$") and the fluid outlet temperature ("$T_o$"). The temperature differential can be calculated in degrees Fahrenheit (° F.) or in degrees Celsius CC). In at least some embodiments, at 450, the computing device 180 can calculate the fluid mass flow rate through the heat-producing computing device 110 using the following formula based upon the specific heat ("$c_p$") of the fluid:

Mass flow rate: $m=q/(c_p \times \Delta T)$

Other formulas can also be used by the calculating device to provide the mass flow rate. In some embodiments, the specific heat of the fluid can be manually entered or programmed into the calculating device 180. Where the specific heat of the fluid displays a temperature dependency, the fluid inlet temperature, fluid outlet temperature, or fluid average temperature can be used by the calculating device 180 to determine the correct specific heat. Using air ($c_p$=1.00 kJ/kg-K or 0.24 BTU/lb-° F.) as a non-exclusive illustrative example, the fluid mass flow rate can be determined using the following formulas:

Mass Flow (lb/min): $m=4.2 \times (q(\text{in BTU/min})/\Delta T(\text{in ° F.}))$ Mass Flow (kg/min): $m=1.0 \times (q(\text{in kJ/min})/\Delta T(\text{in ° C.}))$ At 460, the calculating device can convert the calculated fluid mass flow rate to a volumetric flow rate using the density ("$\rho$") of the fluid. Since density displays a temperature dependency, the fluid inlet temperature, fluid outlet temperature, or fluid average temperature can be used by the calculating device 180 to determine the density of the fluid. In at least some embodiments, the calculating device 180 can use the following formula to calculate the volumetric flow rate through the heat-producing computing device 110:

Volumetric flow rate: $V=m/\rho$

Once again using air ($\rho$=1.184 kg/m³ or 0.074 lb/ft³) as a non-exclusive illustrative example, the fluid volumetric flow rate can be determined using the following formulas:

Volumetric flow rate (ft³/min): $V=13.5 \times m(\text{in lb/min})$

Volumetric flow rate (m³/min): $V=0.84 \times m(\text{in kg/min})$

The use of observed parameters such as fluid inlet and outlet temperatures and current can permit an accurate determination of fluid flow rate in 460 regardless of the internal configuration of the at least one heat-producing computing device 110. Systems relying instead on estimating the fluid flow rate through at least one heat-producing computing device 110 based wholly or partially upon one or more fluid mover 260 performance characteristics, such as current draw or speed, may provide an erroneous fluid flow rate when internal components within the at least one heat-producing computing device 110 are added, removed, or reconfigured.

Figure 5:
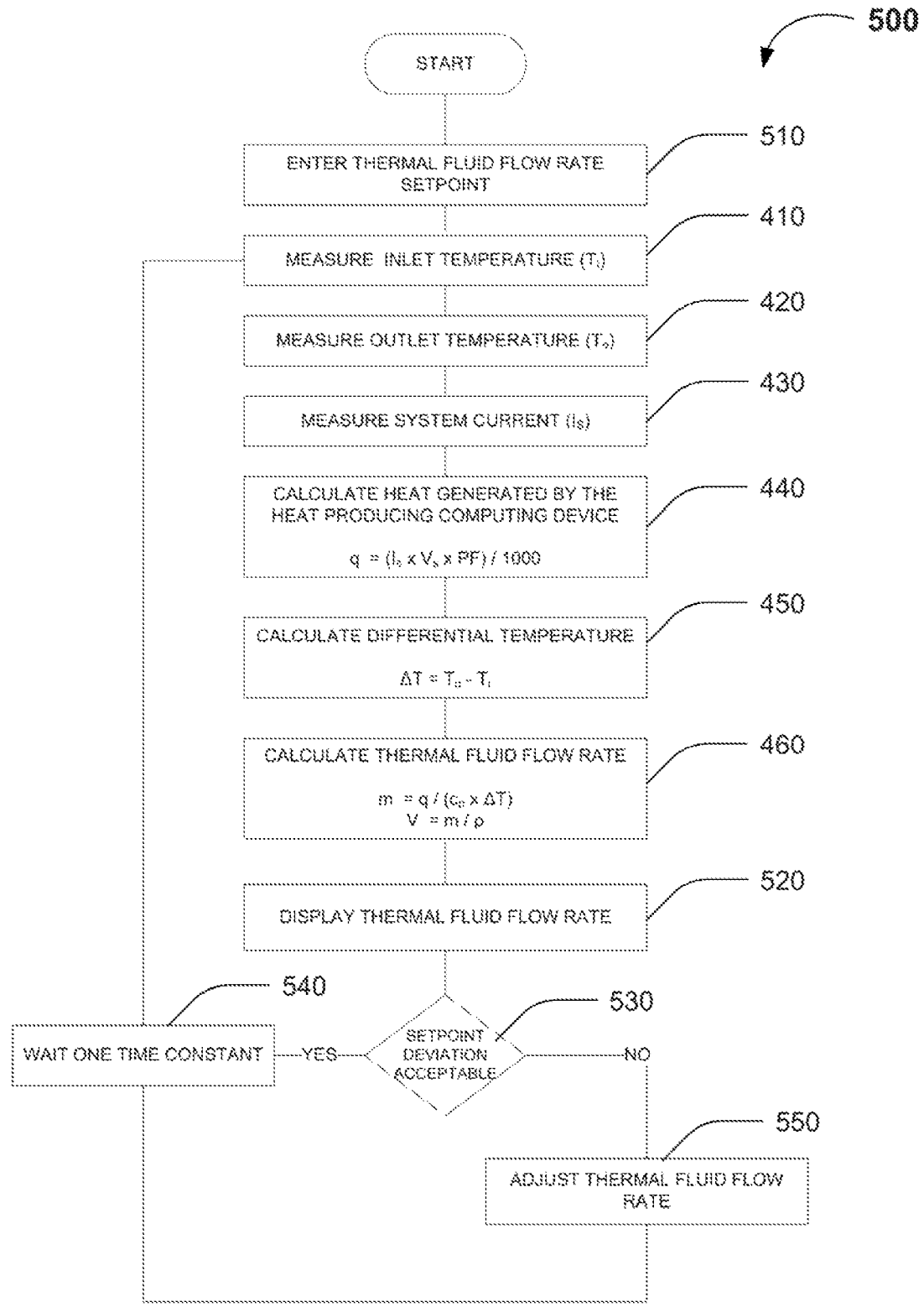
FIG. 5 is a flow diagram depicting an embodiment of another illustrative flow measurement method, according to one or more embodiments described herein.

FIG. 5 is a flow diagram depicting an embodiment of another illustrative flow measurement method 500. In at least some embodiments, the fluid flow through the heat-producing computing device 110 can be controlled or modulated based upon one or more predetermined parameters. For example, in some embodiments, in 510 a predetermined volumetric fluid flow rate setpoint can be entered into the calculating device 180. After the calculating device 180 determines the volumetric flow rate, using for example the method in 410 through 460, and described in detail with regards to FIG. 4, the fluid flow rate can be displayed, for example using the at least one display device 250 in 520.

In at least some embodiments, the inlet fluid temperature, the outlet fluid temperature, the current flow, the fluid flow rate, or any combination thereof can be transmitted to one or more external systems, for example an environmental control system adapted to control or adjust one or more environmental control system parameters in response to sensed or measured conditions. Illustrative, non-limiting environmental control system parameters can include environmental control system heat output, environmental control system cooling output, wet bulb temperature, dry bulb temperature, ambient temperature, and relative humidity.

At 530, the calculating device 180 can determine whether the fluid flow rate is within an acceptable range of the setpoint entered in 510. If the fluid flow rate is within an acceptable range of the setpoint entered in 510, the calculating device 180 can delay for one time constant in 540 before again calculating the fluid flow rate (in 410 through 460) and comparing the actual flow rate to the setpoint in 530.

If the fluid flow rate is not within an acceptable range of the setpoint entered in 510, the calculating device 180 can adjust the fluid flow rate in 550. In at least some embodiments, the calculating device 180 can adjust the fluid flow rate by altering the cross sectional area of the fluid inlet 120. In at least some embodiments, the calculating device 180 can adjust the fluid flow rate by altering the cross sectional area of the fluid outlet 130. In at least some embodiments, the calculating device 180 can adjust the fluid flow rate by altering the capacity of the fluid mover 260.

Though depicted sequentially for convenience, discussion and readability, at least some of the actions, steps, or sequences shown in FIGS. 4 and 5 can be performed in a different order and/or in parallel. Additionally, one or more specific embodiments may perform only a limited number of the actions, steps, or sequences shown in FIGS. 4 and 5. Additionally, one or more actions, steps, or sequences can be performed using a second calculating device disposed proximate or remote from the calculating device 180 executing all or a portion of the one or more actions, steps, or sequences depicted in FIGS. 4 and 5.

Certain embodiments and features have been described using a set of numerical upper limits and a set of numerical lower limits. It should be appreciated that ranges from any lower limit to any upper limit are contemplated unless otherwise indicated. Certain lower limits, upper limits and ranges appear in one or more claims below. All numerical values are "about" or "approximately" the indicated value, and take into account experimental error and variations that would be expected by a person having ordinary skill in the art.

While the foregoing is directed to embodiments of the present invention, other and further embodiments of the invention may be devised without departing from the basic scope thereof, and the scope thereof is determined by the claims that follow.

What is claimed is:

1. A fluid-flow control system comprising:
    a heat-producing computing device including a fluid inlet and a fluid outlet;
    an inlet fluid temperature sensor to measure a temperature of a fluid at the fluid inlet and an outlet fluid temperature sensor to measure a temperature of the fluid at the fluid outlet;
    a current sensor to measure the current supplied to at least a portion of the heat producing computing device;
    a calculating device to calculate a fluid flow rate based at least in part on the inlet fluid temperature, the outlet fluid temperature, and the calculated fluid flow rate; and
    a flow-control device to adjust an actual fluid flow rate through the heat-producing computing device based at least in part upon the calculated fluid flow rate.

2. The system of claim 1, wherein the heat-producing computing device comprises a rack and a blade mount server disposed at least partially within the rack.

3. The system of claim 1, wherein the calculating device is further to:
    accept input of an inlet fluid flow rate setpoint;
    compare the actual fluid flow rate to the setpoint; and
    cause the flow-control device to adjust the actual fluid flow rate based upon the deviation of the calculated fluid flow rate from the setpoint.

4. The system of claim 3, wherein the calculating device is operably connected to the at least one fluid inlet to adjust the actual flow rate by controlling an open cross sectional area of the fluid inlet.

5. The system of claim 3:
    wherein the calculating device is coupled to the flow-control device; and
    wherein a capacity of the flow-control device is adjustable based on the calculated fluid flow rate.

6. The system of claim 1, further comprising at least one display device coupled to the calculating device to display the calculated fluid flow rate.

7. A fluid flow control method, comprising:
    measuring an inlet fluid temperature to at least one heat-producing computing device using at least one inlet temperature sensor disposed to sense temperature at an input of the computing device;
    measuring an input current to the heat-producing computing device using at least one current sensor;
    measuring a discharge fluid temperature from the at least one heat-producing computing device using at least one outlet temperature sensor disposed to sense temperature at an outlet of the computing device;
    calculating a fluid flow rate based at least in part on the inlet fluid temperature, the discharge fluid temperature, and the input current; and
    adjusting an actual fluid flow rate through the computing device based at least in part on the calculated fluid flow rate.

8. The method of claim 7 further comprising,
    displaying the calculated fluid flow rate on at least one display device; and
    transmitting the calculated fluid flow rate to an environmental control system.

9. The method of claim 8, further comprising adjusting at least one environmental control system parameter, wherein the at least one parameter is selected, from the group of parameters consisting of: environmental control system heat output, environmental control system cooling output, wet bulb temperature, dry bulb temperature, ambient temperature, and relative humidity.

10. The method of claim 7, further comprising:
    entering a fluid flow rate setpoint;
    comparing the calculated fluid flow rate to the setpoint; and
    adjusting the actual fluid flow rate through the heat-producing computing device based upon the deviation of the calculated fluid flow rate from the entered fluid flow rate setpoint.

11. The method of claim 10, wherein adjusting the actual fluid flow rate includes altering a cross sectional area of a fluid inlet.

12. The method of claim 10, wherein adjusting the actual fluid flow rate includes altering a pumping rate of the flow-control mechanism.

13. The method of claim 7, wherein the fluid is air.

14. The method of claim 7, wherein the at least one heat-producing computing device includes a rack and a computing device disposed at least partially within the rack.

15. The method of claim 14, wherein at least a portion of the heat-producing computing device includes a calculating device.

16. The method of claim 7 wherein the calculating the calculated fluid flow rate includes:
- calculating a heat generated by the heat-producing computing device based upon the input current;
- calculating a differential temperature by subtracting the inlet temperature from the outlet temperature; and
- calculating the calculated fluid flow rate based upon the heat generated and the differential temperature.

* * * * *

UNITED STATES PATENT AND TRADEMARK OFFICE
CERTIFICATE OF CORRECTION

| | | |
|---|---|---|
| PATENT NO. | : 9,055,698 B2 | Page 1 of 1 |
| APPLICATION NO. | : 13/387068 | |
| DATED | : June 9, 2015 | |
| INVENTOR(S) | : Brandon Rubenstein et al. | |

It is certified that error appears in the above-identified patent and that said Letters Patent is hereby corrected as shown below:

In the Claims

In column 7, line 67, in Claim 1, delete "heat producing" and insert -- heat-producing --, therefor.

In column 8, line 53, in Claim 9, delete "selected," and insert -- selected --, therefor.

Signed and Sealed this
Twenty-ninth Day of March, 2016

Michelle K. Lee
*Director of the United States Patent and Trademark Office*